United States Patent [19]

Brown et al.

[11] 4,215,282

[45] Jul. 29, 1980

[54] TEMPERATURE COMPENSATED SENSE AMPLIFIER FOR PROMS AND THE LIKE

[75] Inventors: George W. Brown, San Jose; Thomas L. Reynolds, Sunnyvale, both of Calif.

[73] Assignee: Advanced Micro Devices, Inc., Sunnyvale, Calif.

[21] Appl. No.: 930,512

[22] Filed: Aug. 3, 1978

[51] Int. Cl.² ............................................. H03K 5/153
[52] U.S. Cl. ................................... 307/364; 307/237; 307/310; 307/DIG. 3
[58] Field of Search ............... 307/237, 310, 354, 362, 307/364, DIG. 3; 357/51

[56] References Cited

U.S. PATENT DOCUMENTS

| | | | |
|---|---|---|---|
| 3,668,429 | 6/1972 | Ainsworth | 307/310 X |
| 3,716,722 | 2/1973 | Bryant et al. | 307/310 X |
| 3,872,450 | 3/1975 | Reynolds | 357/51 X |
| 4,042,950 | 8/1977 | Price | 357/51 |

*Primary Examiner*—John Zazworsky
*Attorney, Agent, or Firm*—Thomas Schneck, Jr.; J. Ronald Richbourg

[57] ABSTRACT

A sense amplifier and sensing scheme for sensing the normal or blown condition of fuses in a programmable read only memory (PROM) or similar device. A sensing circuit is provided with a threshold level separating high and low input levels indicative of the fuse condition. The sensing circuit has one circuit branch with a first current mirror with a temperature characteristic which provides a threshold level which is slightly divergent with reference to a low level input. Another circuit branch clamps the high input level to the slightly divergent threshold level and uses a second current mirror with a temperature characteristic which provides a high level slightly more divergent than the threshold level. By selecting mirror currents proportionally, high level and threshold level temperature characteristic divergence can be proportionally controlled in selected amounts with respect to the low level. Current sources for the sense amplifier are made to offset voltage fluctuations, making the sense amplifier highly insensitive to voltage fluctuations in addition to temperature variations.

9 Claims, 7 Drawing Figures

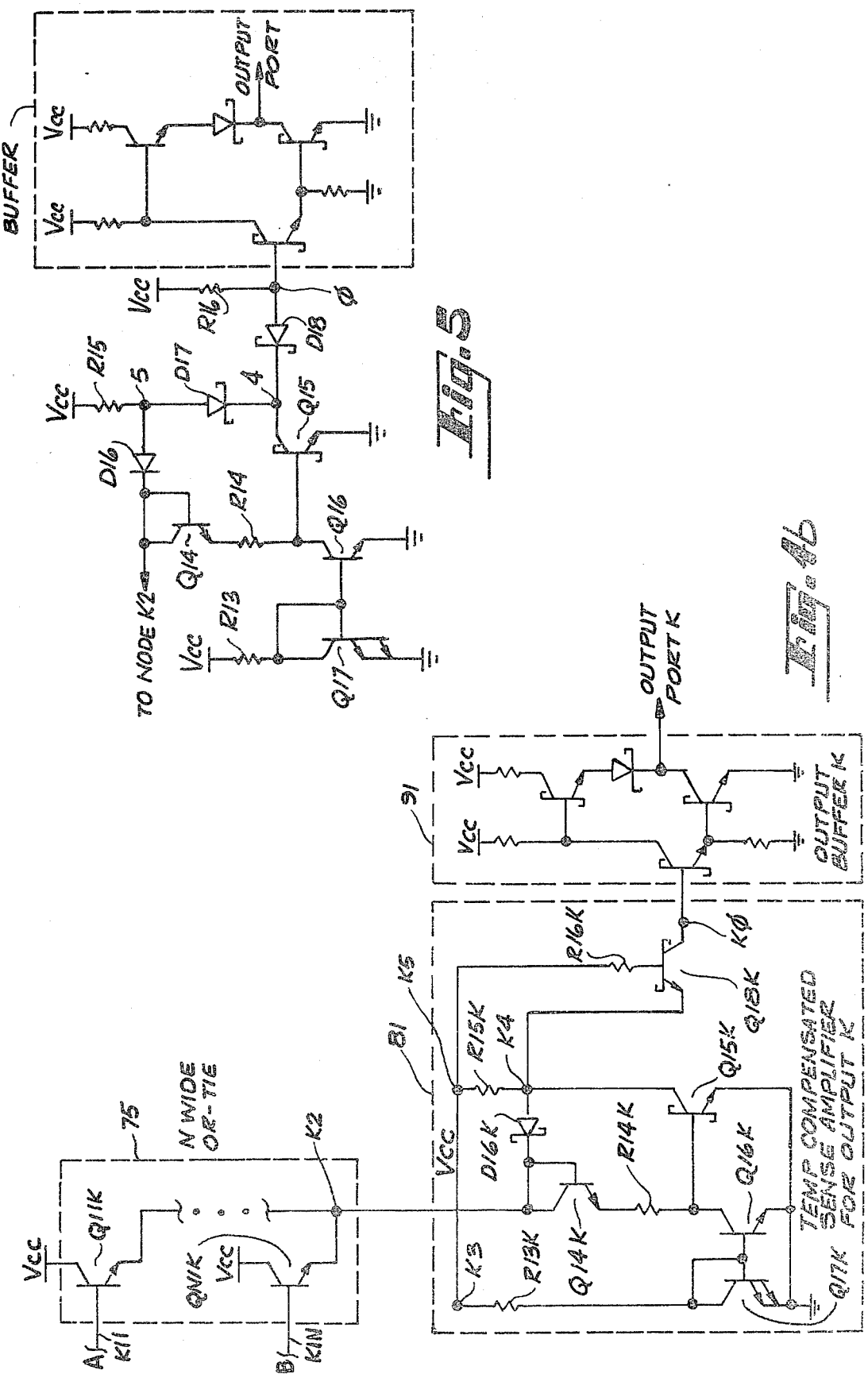

TEMPERATURE COMPENSATED SENSE AMPLIFIER FOR PROMS AND THE LIKE

BACKGROUND OF THE INVENTION

1. Field of the Invention

The invention relates generally to programmable read only memories (PROMs) and more particularly to temperature compensated sense amplifiers for detecting the fuse condition of a PROM or similar device.

2. Prior Art

PROMs typically consist of devices, such as transistors, which are joined by fusible links to intersections of rows and columns of wires or buses in an array. The devices may be electrically removed from the row and column array by opening a connecting fusible link, usually done by resistively heating the fusible link until it vaporizes. For example, U.S. Pat. No. 4,042,950 to Price and assigned to the assignee of the present invention, shows a platinum silicide fuse link connecting a Schottky diode and an associated transistor to a conductive bus. Opening or blowing the fuse link disconnects the transistor from the bus.

Prior art sense amplifiers used to sense fuse condition are temperature sensitive. This causes the time between an address change and the resultant output response to that address change to vary at temperature extremes at which semiconductor PROMs are often rated, namely between $-55°$ C. and $125°$ C.

In the prior art, a switching transistor is typically employed to detect the high or low level of a fuse location, thereby indicating whether or not a fuse has been blown. On and off switching states for the transistor are separated by a threshold voltage between a low level voltage and a high level voltage. Previously at low temperatures, the low level, threshold and high level were widely spaced, causing the time delays mentioned previously, while at high temperatures the three levels tended to converge toward each other thereby reducing noise immunity or causing the devices to sometimes become nonfunctional.

SUMMARY OF THE INVENTION

It is an object of the invention to devise a temperature compensated sense amplifier wherein the low, threshold and high levels of a switching transistor used to detect the condition of a storage cell diverge with respect to each other with increasing temperature, rather than converge, so that a smaller separation between these levels exists at low temperatures for good circuit response time and a greater separation exists at higher temperatures thereby giving the circuit near constant noise immunity and near flat a.c. performance over its rated temperature range.

The above object has been achieved in a sense amplifier having a two state switch with high and low output levels adjusted by two special circuits utilizing current mirrors for adjustment of the desired level. A first circuit is connected to the input switch which generates a low level corresponding to an off state of the input switch, such that an off state would indicate an intact fuse condition, e.g., not blown. The low level is referenced below and near the switching threshold of the input switch. A current mirror is provided in one branch of the first circuit with a temperature dependence characteristic for reversing the usual convergence of the threshold level toward the low level.

A second circuit is connected to the input side of the input switch for clamping high level inputs to the switch with reference to the switching threshold level. The second circuit is provided with another current mirror with a temperature dependence characteristic relative to the threshold level which reverses a temperature characteristic in which the high input converges toward the threshold. The resultant levels are such that the threshold level diverges from the low level and the high level diverges from the threshold level with increasing temperature. Hence, at low temperatures, the low, threshold and high levels are relatively closely spaced, but at high temperatures the levels are more widely spaced and divergent, thereby providing greater noise margin at these elevated temperatures.

BRIEF DESCRIPTION OF THE DRAWINGS

FIGS. 4a and 4b are electrical schematics of a temperature compensated sense amplifier exemplifying its use in a typical bipolar PROM application.

FIG. 5 is an alternate embodiment of the temperature compensated amplifier of the present invention with increased speed performance at the interface between the sense amplifier and an output buffer.

FIG. 6 is an electrical schematic of current sources shown symbolically in FIG. 1 and FIG. 4a.

DESCRIPTION OF THE PREFERRED EMBODIMENT

With reference to the following text and to figures described therein, certain integer suffixes (K, M, N) will be noted on device designations, node numbers, etc. These suffixes are used to provide a generalized description of a PROM array or similar device having M rows and $K \times N$ columns. "K" refers to the number of output ports where each of the K ports has "N" unique columns of programmable memory cells. One of these N columns in each of the K outputs is selected by a 1 of N column decoder via Y-address inputs, where $2^y$ is equal to N and Y is the number of Y-address inputs. Each of the $K \times N$ columns contains "M" programmable memory cells or bits providing an array of cells that has $K \times N$ vertical columns by "M" horizontal rows. The horizontally adjacent cells in each of the $K \times N$ columns are connected together via M word lines each of which is driven by a word driver. The M word drivers and therefore the M word lines are uniquely selected by a 1 of M row decoder via the X-address inputs, where $2^x$ is equal to M, and X is the number of address inputs. The device just described would contain a total of $K \times N \times M$ bits or cells of programmable memory organized as $N \times M$ bytes or words, where each byte or word contains K bits. All bits of a K bit wide word or byte, as selected by X and Y address inputs via a one of M decoder and one of N decoder respectively, are read out simultaneously at output port 1 through output port K.

Figure 1:
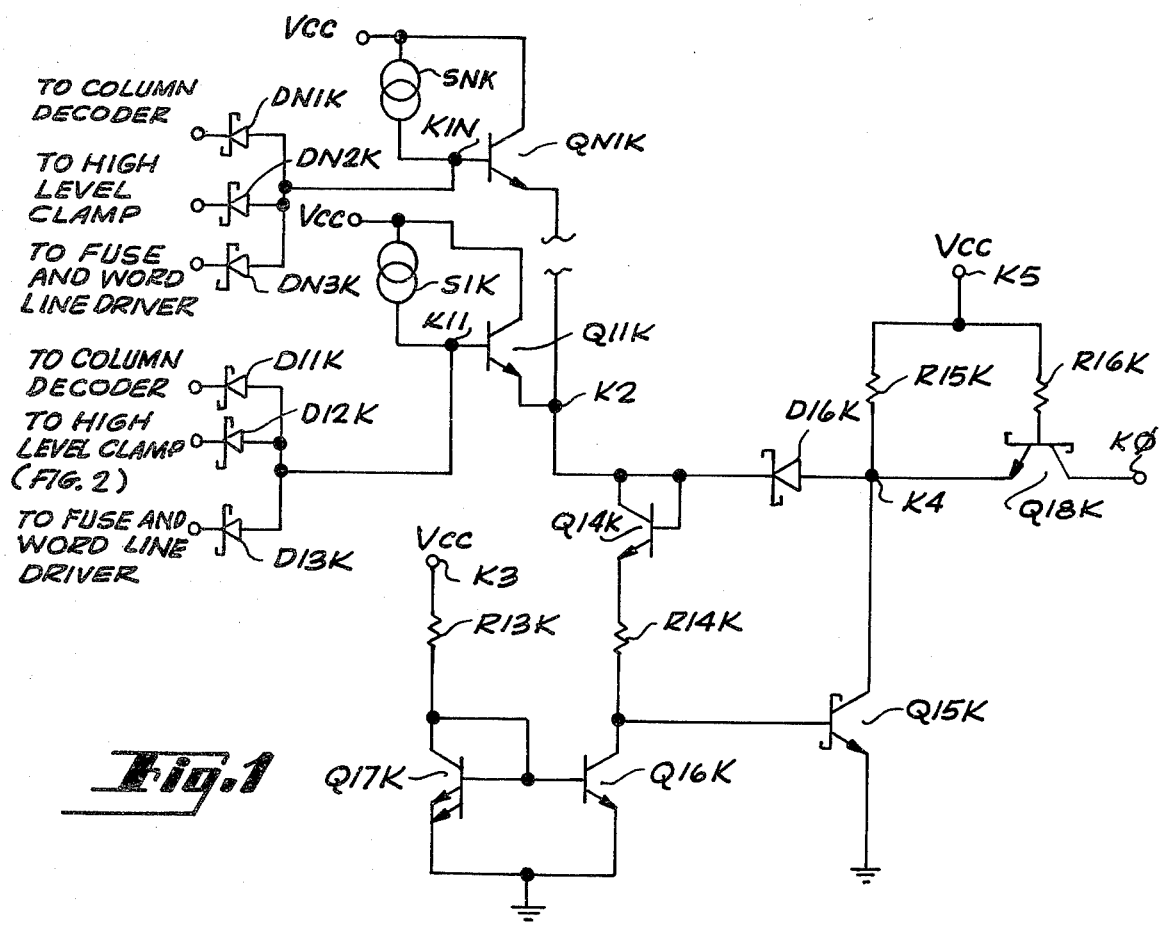
FIG. 1 is a partial electrical schematic of a temperature compensated sense amplifier, showing the sense amplifier input and output switch means, together with a threshold level adjustment circuit.

With reference to FIG. 1, a series of input switching means, transistors Q11K-QN1K, is responsive to the condition of a connected fuse. Each switching means is a transistor which is switched from full on to a nearly off state with reference to a threshold level. In other words, to switch a transistor such as Q11K on, a voltage must rise above the threshold level. On the other hand, voltages below the threshold level will not switch the transistor Q11K fully on. The threshold level similarly affects all input switching transistors through QN1K.

Each input switching transistor, such as Q11k, is an on and nearly off input switching means. The transistor Q11K has an emitter electrode as its output and a base electrode as its input. The base electrode is connected to node K11 which receives base drive current from current source S1K which is also connected to supply voltage $V_{cc}$ and to the collector of transistor Q11K.

Figure 2:
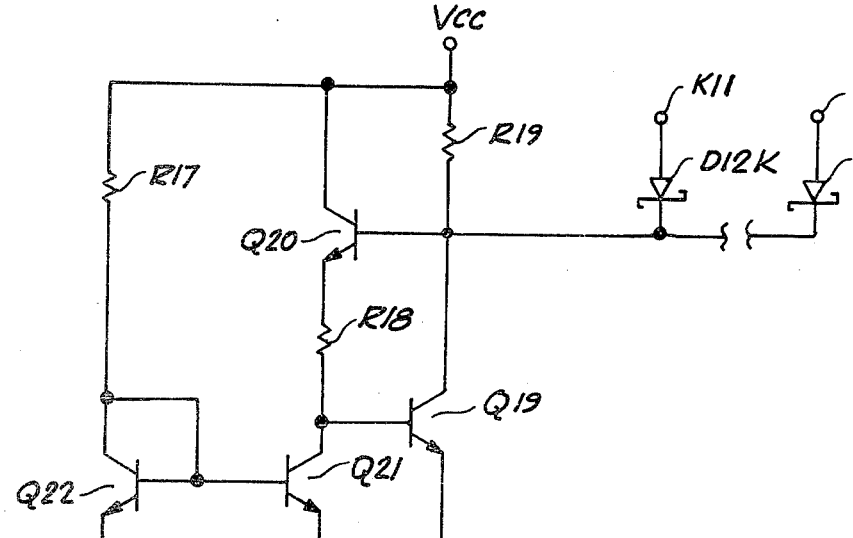
FIG. 2 is a partial electrical schematic of a temperature compensated high level clamp circuit means of the present invention showing a high level clamping circuit which is connected to the input of the circuit shown in FIG. 1.

Input signals to transistors Q11K-QN1K are received through the base electrode of each transistor from the selected column decoder through respective Schottky diodes D11K-DN1K or from the high level clamp of FIG. 2 through Schottky diodes D12K- DN2K if an open fuse is being sensed, or from a word line driver through a fuse and through Schottky diodes D13K-DN3K if an intact fuse is being sensed. When a particular storage cell is sensed, it is necessary to energize a word line by pulling D13K low through an intact fuse via the word line driver while selecting the column line by allowing it to go high via D11K-DN1K. When both are energized, signals will arrive either through diodes D13K-DN3K when sensing an intact fuse which holds the input level below threshold or through diodes D12K-DN2K when sensing an open fuse by applying a level above the threshold level, defined as a high level input signal. This high level is clamped through diodes D12K-DN2K to a desired voltage by the circuit of FIG. 2, described below. This high level condition exists only when a fuse associated with the storage cell is blown. When the fuse is not blown, a low level signal is received by holding the input level below threshold through diodes D13K-DN3K.

It is desirable that the threshold level be set as near as possible to the logic low level of the switching transistor Q11K and yet maintain noise margin. Transistor Q11K is of a type which must be totally on or near off. The threshold of that transistor is the input level above which the transistor switches from one condition to another. The threshold should very closely track the logic level and diverge slightly with increasing temperature, yet maintain a close differential in order to maintain a high degree of noise margin and optimum speed performance.

The node K2 serves as a common tie point in each of the K outputs for all of the switching transistors Q11K-QN1K, a wired OR connection, such that the connected circuits and the output transistor Q18K need not be duplicated for input switching transistors in each column associated with a given output K. However, each output of 1, 2, 3 . . . K outputs, has switching transistors Q11K-QN1K tied together at a common node corresponding to K2, with a common threshold compensation circuit connected as shown in FIG. 1 at node K2 for each output. However, the high level clamping circuit of FIG. 2 is connected to each input electrode of each switching transistor by way of diodes D12K-DN2K. A single high level clamping circuit will suffice for all columns and all outputs of a given PROM.

The switching transistors Q11K-QN1K translate high and low level inputs received at their respective bases to on and near off switch states. The input high and low levels are measured with respect to a threshold level, previously mentioned, and which is adjusted at node K2 by the circuit described herein. Node K2 is one base emitter voltage drop below node K11 . . . K1N. However, by placing the circuit which includes transistors Q14K, Q15K, Q16K and Q17K on the output side of transistors Q11K-QN1K, duplication of the threshold level adjustment circuit is avoided for each fuse and the circuit needs only to be made once for each of the K outputs, as mentioned above.

The input voltage at each node K11-K1N connected to the base of each transistor Q11K-QN1K in FIG. 1 through the diode D13K and through the connected fuse and associated P-N junctions or base-emitter voltage drops is balanced through the base-emitter drop of transistor Q11K and through the voltage drops of a first circuit means connected to the emitter of transistor Q11K. That circuit means includes transistors Q14K, Q15K, Q16K, Q17K, as well as resistors R13K and R14K. The voltage drop from node K2 to ground includes the base-emitter drop of transistor Q14K, the voltage drop through resistor R14K and the base-emitter drop through transistor Q15K to ground. This balancing of voltage drops on both sides of nodes K11-K1N at the threshold switching voltage allows the threshold to be controlled by the temperature characteristic of the base-emitter voltage of Q17K and the ratio of resistors R13K and R14K. If the first circuit means connected to node K2 were not provided, the voltage drops on the sense amplifier side of nodes K11-K1N would cause the threshold level to converge on low level inputs with increasing temperature. However, by balancing the voltage drops on the other side of node K2 with the drops in the first circuit means the convergence between the threshold level and low level inputs can be halted and even reversed by adjusting the current through resistor R14K. The balancing of voltages in the first circuit means is achieved through a first branch including the transistor Q14K, the resistor R14K and the transistor Q15K. A second circuit branch is connected between one side of resistor R14K and the base of transistor Q15K. That second branch comprises the current mirror with transistors Q16K and Q17K connected base-to-base and emitter-to-emitter. The purpose of the second branch is to adjust the current through resistor R14K with increasing temperature. The voltage drop through resistor R14k is mirrored using a well-known principle wherein the current through transistor Q17K defines a base emitter potential which mirrors a proportional current into transistor Q16K which operates similarly to Q17K because it was manufactured simultaneously. The current through transistor Q16K is directly proportional to the current through transistor Q17K with proportionality of currents dependent upon the scaling of emitters in the respective transistors.

The scaling of emitters permits the current in Q17K to potentially be greater than the current through transistor Q16K which might be desirable if a low current gain or beta is anticipated in transistor Q16K. Assuming there is a reasonably high current gain, equal emitter areas and equal currents or even reverse current scaling is then feasible, if reduced power consumption is a factor in the design.

The IR drop through resistor R14K is approximately equal to the resistor ratio R14K/R13K multiplied by the supply voltage at node K3 less the base-emitter drop through transistor Q17K. The resistor ratio of R14K to R13K is a constant, on the order of 0.07 which is used to establish the amount of divergence of threshold level with temperature and to set the desired noise margin. This divergence occurs because it is well understood that base-emitter voltages track negatively with increasing temperature, thus making the voltage drop across R14K track positively in proportion to the current mirrored by R13K. A typical differential voltage drop across resistor R14K with respect to temperature would be 0.127 millivolts per °C. if the ratio of resistor R14K to resistor R13K were approximately equal to 0.07. This is an exemplary value only and other values would occur depending on selective circuit parameters.

When the input to switching transistor Q11K is low, sensing an intact fuse, the transistor Q11K is for all practical purposes off and the transistor Q15K is in a quasiconduction state fed by the base feedback current which flows through resistor R15K and diode D16K and then into the base of transistor Q15K and into the collector of transistor Q16K. Note that the current through R15K must be sufficient to satisfy the mirror current requirements of Q16K, the base drive requirements of Q15K and always supply a collector current to Q15K.

On the other hand, when the input at node K11 is high, sensing an open or blown fuse, transistor Q11K is on and transistor Q15K is receiving base overdrive from transistor Q11K, causing transistor Q15K to saturate and cause a low level output through the output transistor Q18K having an output node K$\phi$ which is connected to a load, such as the input of TTL output buffer K which then would invert the low level to a high at the output port of the device. A typical output buffer K is shown within dashed line 91 of FIG. 4b.

In the case where the switching transistor Q11K is off, the mirrored current is diverted through diode K16K to the supply voltage $V_{cc}$ at node K5 through the resistor R15K. R15K has a value determined by a fraction having a numerator equal to the supply voltage $V_{cc}$ less the base-emitter drops through transistors Q14K and Q15K and less the drop across diode D16K less the drop across resistor R14K divided by the current into the collector of Q16K plus the current into the base of transistor Q15K plus the desired quiescent collector current of transistor Q15K. The high level output of the sense amplifier at node K4 is equal to the base-emitter drop across transistor Q15K plus the drop across resistor R14K plus the base-emitter drop across transistor Q14K plus the drop across diode K16K. This output voltage is more than sufficient to turn off transistor Q18K and allow resistor R16K to provide the needed drive to turn on a load such as TTL output buffer K which has a threshold at node K$\phi$ of approximately two base-emitter drops above ground, or a threshold at node K4 of approximately two base-emitter drops plus the forward base-collector drop of Q18K, less the base-emitter drop of Q18K.

Under these conditions the base-emitter junction of the switching transistor Q11K is biased such that if a high level input were now applied to the base of transistor Q11K it would be the only device being switched on from a nearly off condition. This implies a very narrow transition region and hence high gain.

In the case where the input logic level at node K11 is high which occurs when sensing an open fuse, the transistor Q15K is caused to be driven into saturation as previously mentioned. When the voltage at node K11 is very near the designed threshold level, the threshold voltage at node K11 causes the emitter current of transistor Q11K to satisfy the collector current requirement of the current mirror Q16K through resistor R14K. As the input voltage in node K11 increases beyond this design threshold voltage, the current through resistor R14K increases and becomes additional base drive to transistor Q15K which was initially in a partial state of conduction. This increase in base drive serves to turn on transistor Q15K to a harder state of conduction and ultimately into saturation with excess base drive directed into a Schottky diode which was integrated into the collector-base junction of transistor Q15K. This drives the emitter node of transistor Q18K to a Schottky saturation voltage with respect to ground, turning on transistor Q18K whose collector voltage drops node K$\phi$ to two Schottky saturation voltage drops with respect to ground. This in turn, turns off the TTL output buffer and reflects a high level at the output port of the device's output buffer. Hence an open fuse appears as an output logic one at the output of the TTL output buffer.

The input high level at node K11 is allowed to continue going positive until it is clamped by a temperature compensated high-level clamp, as shown in FIG. 2, which defines enough current through resistor R14K to satisfy the saturation requirements of transistor Q15K and current mirror Q16K. This high level current is typically set to between two and three times the value required to satisfy the collector current requirement of the current mirror transistor Q16K. This means that the high-level clamp voltage at node K11 should be set higher than threshold by an amount greater than or equal to the drop across resistor R14K during an input low level.

The high-level clamp which limits positive overdrive current to the circuit is a second circuit means which is connected to the input node of the input transistor Q11K by way of D12K-DN2K. In FIG. 2 the second circuit means includes a first branch with the transistors Q19 and Q20 and R19 connected to a second circuit branch which comprises a current mirror with the transistors Q21 and Q22 as well as the resistors R17 and R18.

When the input voltage at node K11 is high, the voltage level is equal to the base-emitter drop across transistor Q19 plus the drop across resistor R18 plus the base-emitter drop across transistor Q20 as well as the drop across diode D12K. Once again, the drop across resistor R18 can be made to obey a selected temperature characteristic which is the reverse of what would occur without the second circuit means of FIG. 2. The drop across resistor R18 has approximately twice the temperature coefficient of the drop across resistor R14K of FIG. 1, guaranteeing that the high level clamping voltage at node K11 tracks the threshold voltage of the sense amplifier in a manner similar to the way that the threshold tracks logic low, i.e., in a slightly diverging manner with increasing temperature. Once again, a current mirror is used wherein transistor Q22 mirrors a current into transistor Q21. Transistor Q19 sets the collector voltage of transistor Q21 at one base-emitter drop above ground and the collector current of transistor Q19 shunts current from current sources S1K, ..., SNK, clamped by the diodes D12K, ..., DN2K to ground as required by the number of open fuses being sensed. Resistor R19 in the collector circuit of transistor Q19 is added to provide collector current from the $V_{cc}$ supply when no high level is being clamped and it guarantees transistor Q19 is always in a quiescent "on" state even if a high level is not being sensed. Resistor R19 also provides base drive to transistor Q20 under the same conditions.

The mirrors of the first and second circuit means have similar characteristics and the voltage drop across R18 is made to have two to three times the voltage drop across R14K of FIG. 1, when sensing a low, so that the high level into the sense amplifier at node K11 has a temperature coefficient higher than that of the threshold. A typical temperature coefficient for the high-level clamp would be approximately 0.25 millivolts per °C.

Figure 3:
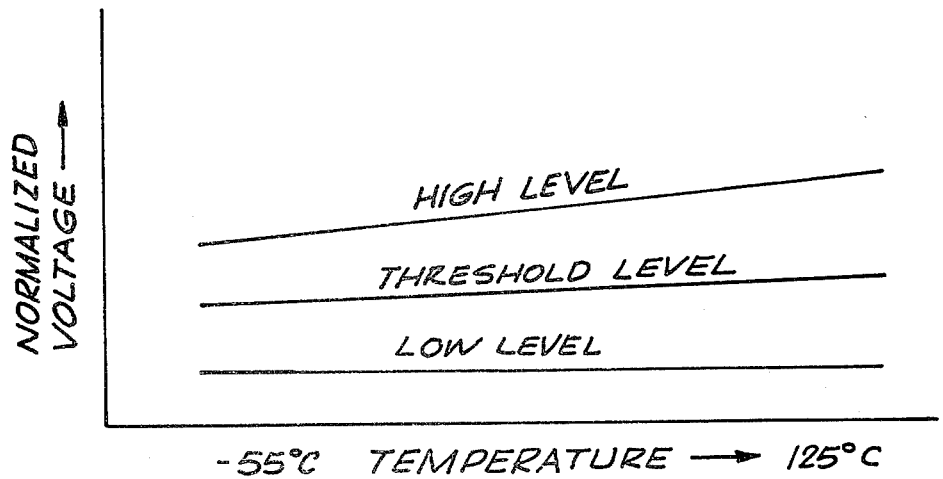
FIG. 3 is a typical graph of normalized voltage versus temperature for an input switching transistor in a sense amplifier of the present invention.

The divergence of the high level with respect to threshold and the divergence of threshold with respect to the low level may be seen in FIG. 3. FIG. 3 shows a graph with increasing voltage as the ordinate and increasing temperature as the abscissa.

The logic low level threshold voltage and logic high level are all normalized to three base-emitter drops or three diode drops above ground which defines the logic low level as having a flat temperature characteristic of 0 millivolts per °C. The normalized threshold voltage level diverges slightly from the normalized logic low at a rate of approximately 0.127 millivolts per °C. while the clamped high level, which is also normalized, diverges at approximately the same rate with respect to the normalized threshold level, so that its total divergence is approximately equal to 0.25 millivolts per °C. with respect to the normalized low level.

Figure 4A:
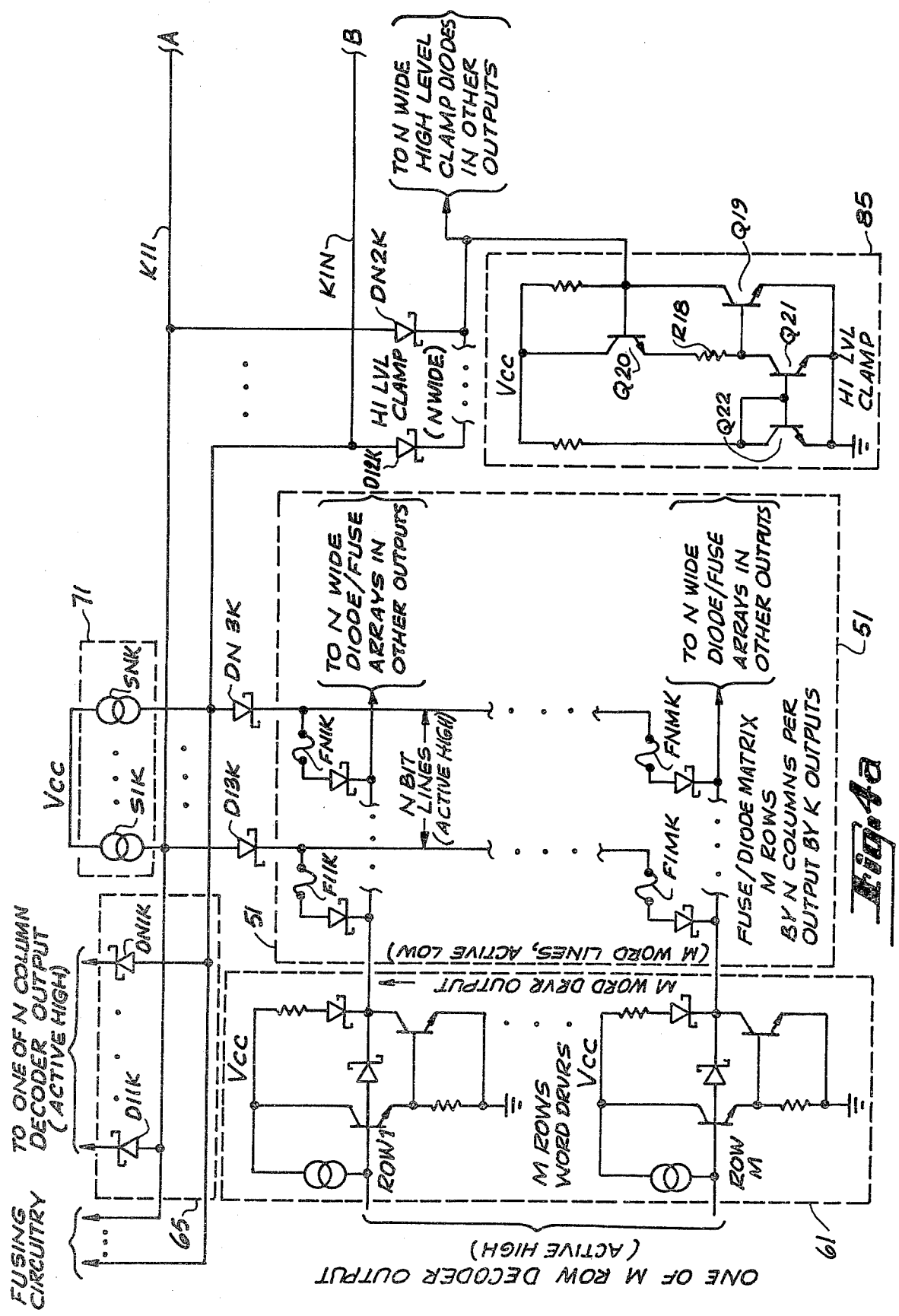

FIGS. 4a and 4b show a complete schematic of a fuse array for a PROM utilizing a temperature compensated sense amplifier of the present invention. In particular, a fuse array is shown within block 51 in FIG. 4a. The array consists of N×K columns and M rows, the rows and columns being joined through corresponding fuses F11K-FN1K in row 1, extending through fuses F1MK-FNMK in row M. Horizontal lines are termed word lines, with each row activated by a word driver circuit within the block 61. Only one of the M word drivers has a low output at any given time as selected by the one of M decode. The selected word driver sinks any current supplied to its word line from the current sources S1K ... SNK through the fuses and array diodes connected to the selected word line.

Columns of the fuse array are selected by a column decoder which drives diodes D11K through DN1K shown within the block 65. Columns are each connected to a current source within the block 71 for providing current flow through the diode and fuse array. Each of the column outputs of the fuse and diode array within block 51 is connected to one of the transistor switches within block 75 of FIG. 4b. The emitters of the transistor switches within block 75 are tied together in an N-wide OR-tie. Node K2 connects the tied switching circuits to the sense amplifier portion within block 81. The current mirror in block 81 is part of a circuit means for adjusting threshold level tracking of logic low, with some positive divergence, with increasing temperature. This creates the temperature compensated sense amplifier of the present invention. The input to each of the switching transistors is connected to the high level clamp shown within block 85. The sense amplifier portion in block 81 is connected to the K output buffer within block 91 which has a designed turn-on potential of approximately two base-emitter drops. The K output port of the buffer within block 91 is connected to a TTL load. These circuits operate as previously described and are illustrated in FIGS. 4a and 4b for the purpose of showing their mutual cooperation.

FIG. 5 shows a version of the sense amplifier of FIG. 1 that has been modified to improve the switching speed at node $\phi$. This has been accomplished by inserting diode D17 between the collector of Q15 and node 5, by connecting R16 to node $\phi$, and replacing Q18K in FIG. 1 with diode D18. The purpose of D17 is to lower the voltage on the Q15 collector node from what it is in the circuit of FIG. 1 when Q15 is in the quasi-conduction state described earlier. In this state of conduction the Q15 collector node potential of FIG. 5 will be two base-emitter drops plus the R14 voltage drop above ground. This is because the voltage drops across D16 and D17 tend to cancel each other. In FIG. 1 the Q15K collector potential will be higher than that of Q15 in FIG. 5 by the amount of voltage dropped across D17 which is typically 500 millivolts. The circuit of FIG. 5 requires less time to pull node $\phi$ to the output buffer threshold level when Q15 is driven into the full on state because the Q15 collector node is starting to fall from a lower potential toward its final value of an NPN Schottky saturation potential above ground. An NPN emitter-base junction could be used in place of D17. An emitter-base junction would lower the D15 collector node potential an additional 200 millivolts and thereby improve the speed even more, however the D17 diode has the advantage that it can be integrated into Q15's collector and therefore requires less die area than an NPN emitter-base junction.

The replacement of Q18K in FIG. 1 by D18 in FIG. 5 causes the potential on node $\phi$ to be higher by typically 250 millivolts in the circuit of FIG. 5 than in the circuit of FIG. 1 when Q15 is in the saturated state. In FIG. 1 the low level on node K$\phi$ is two NPN Schottky saturation voltage drops above ground whereas in circuit 5 node $\phi$ is a Schottky saturation voltage plus a Schottky diode drop above ground. Thus node $\phi$ is closer to the turn-on threshold potential of the output buffer in the circuit of FIG. 5 and it will take less time to switch the output buffer when Q15 goes from full on to its quasi-conduction state.

The trade-off of the scheme presented in FIG. 5 compared to that of FIG. 1 is that it has less immunity to noise since the collector of Q15 is closer in potential to the input turn off threshold voltage of the output buffer at node $\phi$. Also the low level on node $\phi$ when Q15 is fully on is closer to the output buffer turnon threshold at node $\phi$.

Figure 6:
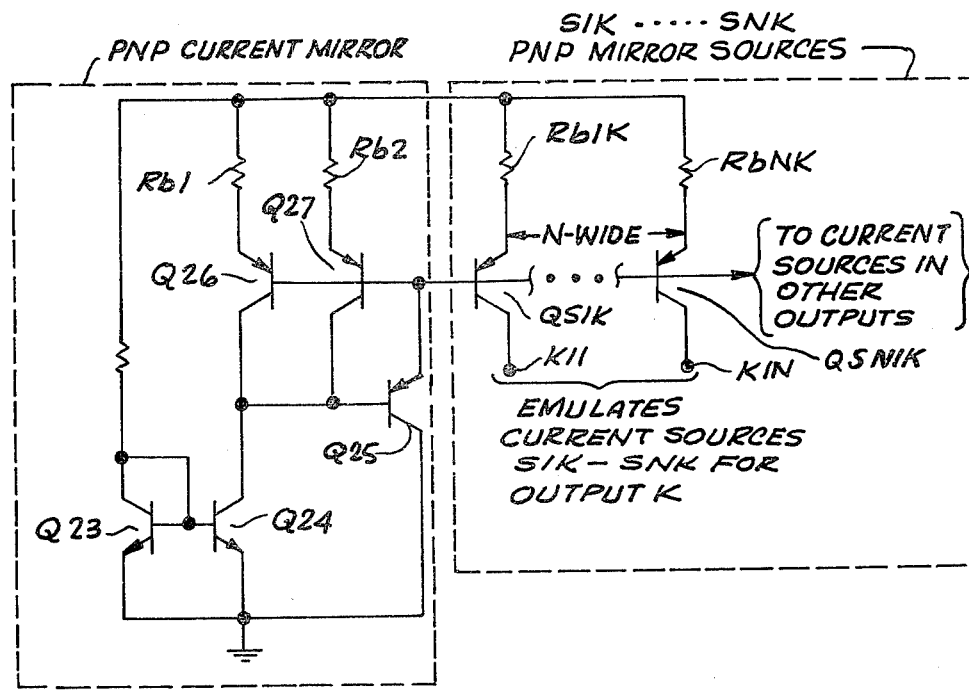

FIG. 6 illustrates a preferred current source configuration for optimizing $V_{cc}$ tracking of logic low to that of the sense amplifier and high level clamp. The current sources S1K-SNK within block 71 of FIG. 4 were previously assumed to be constant sources of current. The logic low level with respect to threshold is also assumed constant. However, the fuse elements have an inherent resistance as do the Schottky diodes and other circuit elements in the low level current path. In order to make the sense amplifier fully compensated against changes in $V_{cc}$, the column current sources S1K-SNK should track with $V_{cc}$ and temperature as do the mirror sources in a high level clamp and the mirror sources of the sense amplifier. This is accomplished in the circuit of FIG. 6 wherein the current mirror Q23 and Q24, connected across substrate PNP transistor Q25, provides a voltage and temperature compensated current for transistors Q26 and Q27 which are PNP mirror current source transistors which mirror their scaled and compensated currents into PNP transistors QS1K ... QSNK.

The vertically integrated substrate PNP transistor Q25 is added to provide base drive for PNP transistors Q26, Q27 and QS1K through QSNK. This allows these transistors to be fabricated utilizing inherently low beta PNP transistors such as laterally integrated PNP devices. Q25, being vertically integrated, can have much higher beta and hence will buffer the cumulative base drive required for Q26, Q27 and QS1K ... QSNK from swamping the current in the NPN mirror source Q24. Additional PNP mirror devices can be added in conjunction to Q26 and Q27 shown in FIG. 6, as required, if the mirror source current supplied by Q24 is scaled proportionally. This may be desirable if the anticipated base current from Q25 could significantly swamp the Q26 and Q27 mirror current. Ballast resistors Rb1, Rb2 and Rb1K ... RbNK) are added between the emitters of all PNP transistors and $V_{cc}$ (except Q25) to reduce second order effects such as to minimize the effect of metal drops which could cause current hogging due to the debiasing of current sources remote from the PNP current mirror.

Since the PNP mirror sources S1K ... SNK of FIG. 6 have nearly identical temperature and voltage characteristics to those of the mirror sources employed in both the sense amplifier and high level clamp, the IR drops of the fuse elements, array diodes and other circuit elements in the low level path closely track with the threshold level and high level clamp voltage across both supply voltage and temperature, as discussed earlier. This voltage and temperature tracking of the IR drops in the low level path effectively cause the margins between the low level and the threshold as well as the margin between the low level and the high level to be largely insensitive to changes in either the temperature or the $V_{cc}$ supply voltage. This leads to very flat and predictable a.c. performance as well as dependable functionality across all rated temperature and supply voltage extremes. Rather than providing current sources S1K ... SNK at nodes K11 ... K1N, it is possible to use pullup resistors to $V_{cc}$ on these nodes. The PNP mirrored current source scheme described here is superior to this approach because it provides a current to these nodes that increases with temperature and $V_{cc}$ supply voltage in a manner that tracks the sense amplifier threshold. Furthermore, the variations in the current source value over changes in temperature, $V_{cc}$ supply voltage and voltage potential on nodes K11 ... K1N are much less than for pull up resistors, thereby giving a more constant overall a.c. performance for the current source scheme described.

The sense amplifier of the present invention is especially adapted for bipolar processing technology but is not restricted to such where equivalent circuits could be carried out in other technologies. Moreover, the values of divergence and of circuit parameters stated herein are understood to be exemplary and other values could be readily derived by those skilled in the art.

What is claimed is:

1. A sense amplifier for sensing high and low logic levels derived from the blown and unblown conditions of fuses in a programmable read only memory array, comprising:
    a transistor switch having two conduction states and being connected to receive high and low logic levels indicative of blown and unblown fuse conditions, respectively, and to switch between said two conduction states;
    sense amplifier circuit means disposed for establishing a threshold level relative to said logic low voltage by creating a voltage across said sense amplifier means so that said threshold level increases relative to said logic low level with increasing temperature; and,
    clamping circuit means disposed for establishing said logic high level, said clamping circuit means having a high-level voltage characteristic with respect to said threshold level which increases with increasing temperature.

2. The sense amplifier of claim 1 wherein said sense amplifier circuit means comprises a current mirror having a pair of current carrying branches, each branch having at least one transistor and at least one resistor therein, with a scaled emitter in one branch with respect to a corresponding emitter in the other branch for generating a current that develops a voltage across the resistor in said other branch, said developed voltage forming an integral part of said threshold level and having an increasing characteristic with respect to increasing temperature.

3. The apparatus of claim 1 wherein said circuit means for clamping logic high levels has a voltage characteristic which increases relative to said threshold voltage for increasing temperature to approximately the same extent as said threshold voltage increases relative to said logic low voltage.

4. The apparatus of claim 1 wherein at least one current source is connected to said transistor switch from a voltage supply, said current source having a current mirror means for offsetting current fluctuations due to voltage and temperature fluctuations.

5. In a fuse array, a temperature compensated circuit apparatus for providing different outputs in response to a fuse condition comprising,
    a plurality of transistor switches, each switch having an input and an output, each input connected for sensing the condition of fuses, each of said switches being adapted to sense high and low logic levels indicative of a blown and unblown fuse condition, respectively, and to switch between conduction states relative to a threshold level between said high and low logic levels,
    a threshold level adjustment circuit means coupled to each output of said switches and being disposed for increasing said threshold level in said transistor switches with increasing temperature, and
    a high level adjustment circuit means for increasing said high logic level with respect to said threshold level in said transistor switches with increasing temperature.

6. The circuit apparatus of claim 5 wherein said threshold level adjustment circuit means comprises a current mirror having a pair of current carrying branches, each branch having at least one transistor and at least one resistor therein, with a scaled emitter in one branch with respect to a corresponding emitter in the other branch for generating a current that develops a voltage across the resistor in said other branch, said developed voltage forming integral part of said threshold level and having an increasing characteristic with respect to increasing temperature.

7. The circuit apparatus of claim 5 wherein said high level adjustment circuit means comprises a current mirror having a pair of current carrying branches, each branch having at least one transistor and at least one resistor therein, with a scaled emitter in one branch with respect to a corresponding emitter in another branch for generating a current that develops a voltage across the resistor in said other branch, said developed voltage forming an integral part of said high logic level and having an increasing characteristic.

8. The circuit apparatus of claim 5 wherein the high level adjustment circuit means has a voltage characteristic which increases relative to said threshold voltage for increasing temperature to approximately the same extent as said threshold voltage increases relative to said logic low voltage.

9. The circuit apparatus of claim 5 wherein at least one current source is connected to said transistor switch from a voltage supply, said current source having a current mirror means for offsetting current fluctuations due to voltage and temperature fluctuations.

* * * * *